(12) United States Patent
Kim

(10) Patent No.: US 7,488,672 B2
(45) Date of Patent: Feb. 10, 2009

(54) WELL PHOTORESIST PATTERN OF SEMICONDUCTOR DEVICE AND METHOD FOR FORMING THE SAME

(75) Inventor: Sung Moo Kim, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 125 days.

(21) Appl. No.: 11/493,379

(22) Filed: Jul. 25, 2006

(65) Prior Publication Data

US 2007/0026627 A1 Feb. 1, 2007

(30) Foreign Application Priority Data

Jul. 26, 2005 (KR) .................. 10-2005-0067880

(51) Int. Cl.
*H01L 21/425* (2006.01)
(52) U.S. Cl. .................. 438/514; 257/E21.135
(58) Field of Classification Search ............ 438/510, 438/514, 515, 526, 531
See application file for complete search history.

(56) References Cited

U.S. PATENT DOCUMENTS

| | | | | |
|---|---|---|---|---|
| 4,606,998 A | * | 8/1986 | Clodgo et al. | 430/312 |
| 6,444,410 B1 | * | 9/2002 | Huang et al. | 430/330 |
| 6,458,656 B1 | * | 10/2002 | Park et al. | 438/257 |
| 6,569,606 B1 | * | 5/2003 | Wu et al. | 430/322 |
| 6,627,588 B1 | * | 9/2003 | Hess et al. | 510/176 |
| 6,777,145 B2 | * | 8/2004 | Zhou et al. | 430/30 |
| 6,833,326 B2 | | 12/2004 | Koh et al. | |
| 2003/0186547 A1 | | 10/2003 | Koh et al. | |
| 2005/0176224 A1 | * | 8/2005 | Dae Kyeun et al. | 438/514 |

* cited by examiner

*Primary Examiner*—Alexander G Ghyka
*Assistant Examiner*—Reema Patel
(74) *Attorney, Agent, or Firm*—Andrew D. Fortney

(57) ABSTRACT

Disclosed is a well photoresist pattern of a semiconductor, and the fabrication method thereof. The method includes the steps of: (a) forming a sacrificial oxide layer on a semiconductor substrate; (b) applying a primer on the sacrificial oxide layer; (c) applying a photoresist on the primer; (d) soft-baking the photoresist; (e) exposing the photoresist to light by defocusing the DOF (depth of focus) of the light transmitted to the substrate; (f) post exposure baking the photoresist; (g) developing the photo-exposed photoresist to form a well photoresist pattern; and (h) hard-baking the well photoresist pattern. It is preferable that the exposure is performed by plus(+) defocusing of light.

18 Claims, 3 Drawing Sheets

WELL PHOTORESIST PATTERN OF SEMICONDUCTOR DEVICE AND METHOD FOR FORMING THE SAME

This application claims the benefit of Korean Application No. 10-2005-0067880, filed on Jul. 26, 2005, which is incorporated by reference herein in its entirety.

BACKGROUND OF THE INVENTION

1. Field of the Invention

The present invention relates to a fabrication method for a semiconductor device, and more specifically, to a method for forming a well photoresist pattern having a rounded upper edge. The rounded upper edge in the photoresist pattern may result from defocusing the depth of focus (DOF) of light at a photo exposure step.

2. Description of the Related Art

Photolithography, a basic technique for making a highly integrated semiconductor device, is a process for forming a photoresist pattern on a semiconductor substrate using light.

A conventional method for forming a photoresist pattern is as follows. When a substrate having a photoresist is exposed to light through a mask having a pattern, a photochemical reaction is performed. The light transmitted to the substrate should have a best focus (0 focus) by adjusting the depth of focus (DOF) of the light. In one such process, after eliminating the photo-exposed photoresist using a developing solution, only the photoresist pattern to form a device is left on the substrate. Here, the photoresist pattern has a substantially perpendicular-shaped upper edge. This photoresist pattern plays a mask role on subsequent processes, such as etching and/or ion implantation.

FIG. 1 shows a conventional well ion-implantation process using a photoresist pattern.

A well ion-implantation process is performed on a semiconductor substrate 10 having a photoresist pattern 30a. Here, some of ions 60 injected into the substrate 10 may be scattered as a result of interaction with the perpendicular edge of the photoresist pattern 30a. If scattered ions 60a enter an active area 70, a well proximity effect happens. More specifically, a gate electrode 70a and a source/drain region 70b are formed in the active area 70 by the following process. Therefore, if the scattered ions 60a enter an active area 70, the device may have an increased threshold voltage and a decreased saturation current.

SUMMARY OF THE INVENTION

It is, therefore, an object of the present invention to provide a method for forming a well photoresist pattern having an upper edge rounded by (+) defocusing the DOF of light at a photo-exposure step.

Another object of the present invention is to prevent a well proximity effect when a well ion implantation process is performed, by forming a well photoresist pattern having a rounded upper edge.

To achieve the above objects, an embodiment of a method for forming a well photoresist pattern, according to the present invention, comprises the steps of: (a) forming a sacrificial oxide layer on a semiconductor substrate; (b) applying a primer (e.g., HMDS, hexamethyldisilazane) on the sacrificial oxide layer; (c) applying a photoresist on the primer; (d) soft-baking the photoresist; (e) exposing the photoresist to light and defocusing the depth of focus (DOF) of the light transmitted to the substrate; (f) post exposure baking the photo-exposed photoresist; (g) developing the photo-exposed photoresist to form a well pattern; and (h) hard-baking the well photoresist pattern. It is preferable that the exposure is performed by plus(+) defocusing of light. It is also preferable that an upper edge of the well photoresist pattern has a rounded shape.

This and other aspects of the invention will become evident by reference to the following description of the invention, often referring to the accompanying drawings.

DETAILED DESCRIPTION OF THE INVENTION

To clarify the point of the present invention, techniques known widely to the corresponding technical filed and not directly related to the present invention are not shown in this description. Some components are omitted, exaggerated or proximately illustrated in the accompanying drawings by the same reason, thus the component's size dose not always reflect reality.

FIGS. 2 to 5 show a method for forming a well photoresist pattern according to the present invention.

Figure 1:
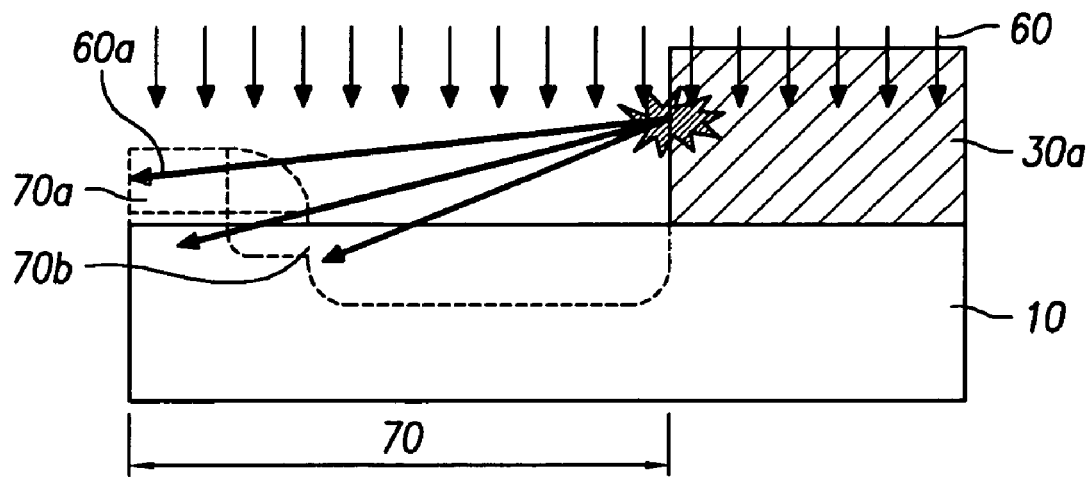
FIG. 1 is a cross-sectional view of a conventional well ion-implantation process using a photoresist pattern.
Figure 2:
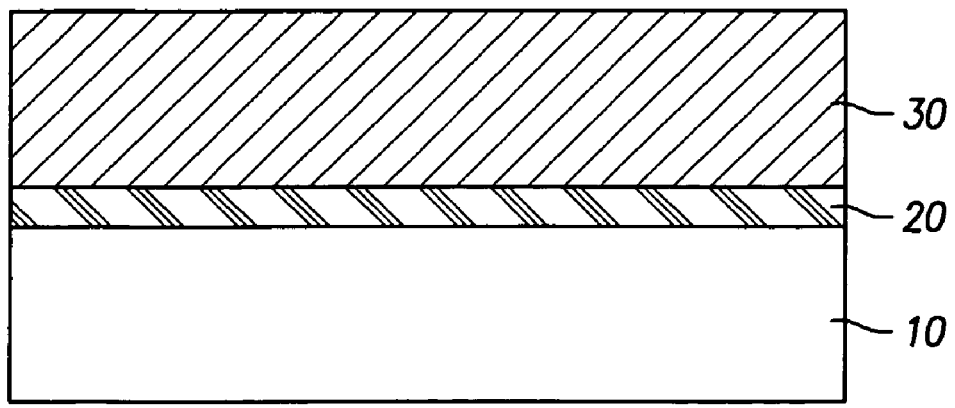
FIG. 2 is a cross-sectional view of a process for forming a sacrificial layer on a substrate and applying a primer (e.g., HMDS, or hexamethyldisilazane) and a photoresist according to the present invention.
Figure 3:
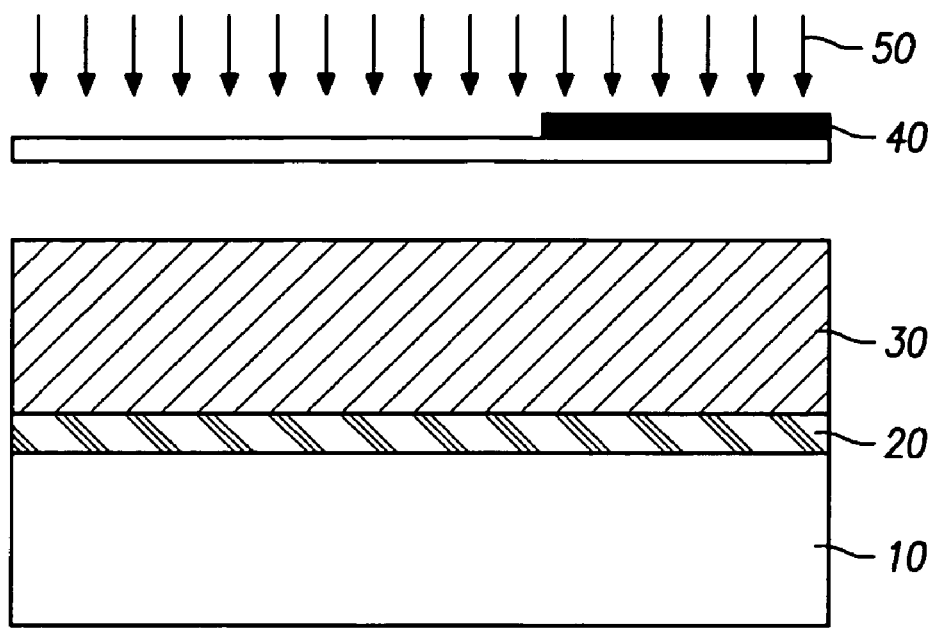
FIG. 3 is a photo exposure process according to the present invention.

As shown in FIG. 2, firstly a sacrificial oxide layer 20 is formed on a semiconductor substrate 10, generally by conventionally depositing silicon dioxide (e.g., by chemical vapor deposition from one or more conventional silicon dioxide precursors), but also by thermal oxide growth (e.g., when the semiconductor substrate 10 comprises or consists essentially of silicon). The oxide layer 20 prevents impurities from entering the substrate deeply as well as reduces damage to the substrate as a result of a subsequent ion-implantation process.

Next, a primer such as hexamethyldisilazane (HMDS) is deposited or formed on the sacrificial oxide layer 20 to increase the adhesive strength of the photoresist. However, other organosilane primers (particularly organosilazane or organosiloxane primers, such as hexaethyldisilazane or hexamethyldisiloxane) may also be suitable. Afterwards, the photoresist 30 is deposited, generally by spin-coating (e.g., rotating the substrate 10 at a high rotational rate) to apply the photoresist 30 in a uniform thin layer on an entire surface of the substrate. Subsequently, a soft-baking process is performed by heating the substrate 10. Generally, in soft baking, the substrate 10 with the spin-coated photoresist 30 thereon is heated at a temperature of from 100 to 300° C. (e.g., from about 130 to about 250° C.) for a length of time sufficient to evaporate substantially all of the solvent from the spin-coating formulation (generally, from 3 to 20 minutes). Evaporating the solvent improves the adhesive strength of the dried photoresist 30.

Subsequently, light 50 is transmitted to the surface of the substrate 10 having an applied photoresist 30 thereon through a well mask 40 using a stepper. Here, it is preferred that the focus of the transmitted light 50 should be plus(+) defocused by adjusting the DOF of the light. The well photoresist pattern can have an upper edge rounded by this process. However, other photolithographic techniques for modifying light absorption in a resist (e.g., partially blocking transmission of light to an edge portion of the photoresist by reducing absorption of light at an edge portion of the mask 40) and/or modifying the focus of light (e.g., by phase-shifting the light through the mask 40) may also be suitable. Then, post exposure baking process is performed. Generally, after exposure, the substrate 10 is heated at a temperature of from 150 to 350° C. (e.g., from about 200 to about 300° C.) for a length of time sufficient to render an exposed (irradiated) or non-exposed (non-irradiated) portion of the photoresist substantially insoluble to the solvent used in a subsequent development step (depending on whether the photoresist is a positive or negative photoresist). Here, a wave-type profile between a photo-exposed region and an unexposed region can be improved.

Figure 4:
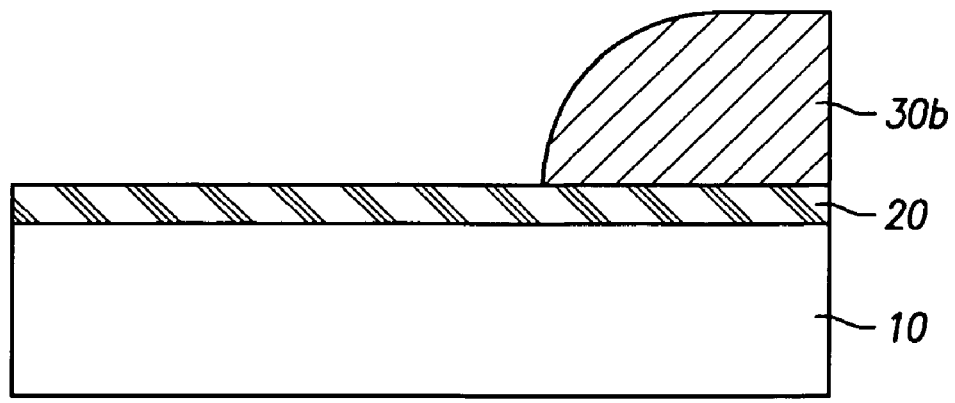
FIG. 4 is a cross-sectional view of a well photoresist pattern according to the present invention.

As shown in FIG. 4, a well photoresist pattern 30b is formed by a developing process. It is preferable that the developing solution comprises an aqueous base such as tetramethylammonium hydroxide (TMAH), although other aqueous, basic development solutions are also acceptable. The developing solution can dissolve portions of the photoresist 30 photochemically reacted by an exposure process. Here, a well photoresist pattern 30b having a rounded upper edge is completed. After that, a hard-baking process is performed. A well photoresist pattern 30b is dried and hardened by hard baking so that the adhesive strength of the photoresist pattern to the substrate 10 is increased. Generally, in hard baking, the substrate 10 is heated at a temperature of from 200 to 400° C. (e.g., from about 250 to about 350° C.) for a length of time sufficient to improve adhesion of the developed photoresist to the underlying substrate (or sacrificial oxide).

Figure 5:
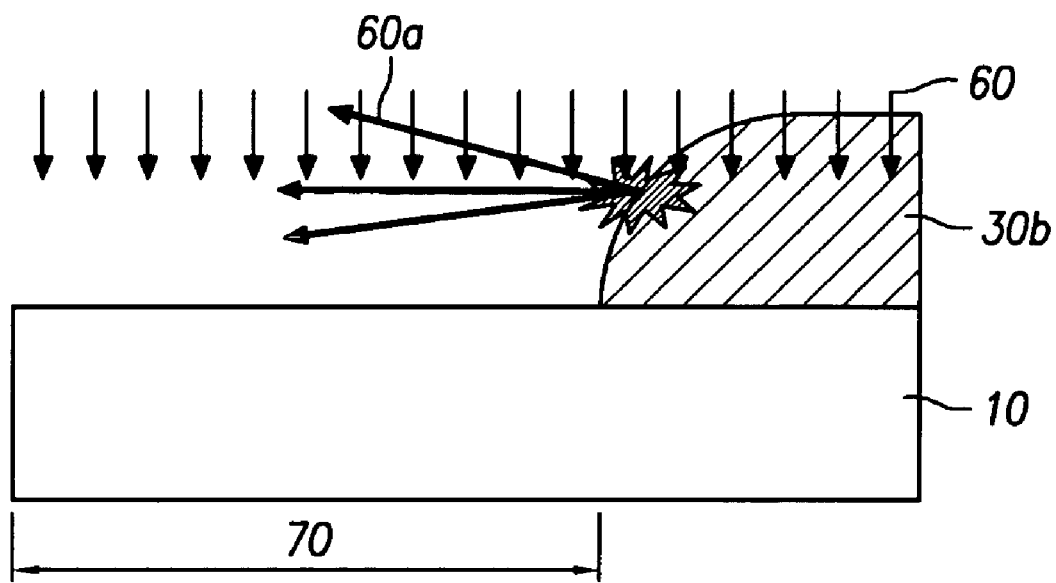
FIG. 5 is a well ion-implantation process using a well photoresist pattern according to the present invention.

The resulting well photoresist pattern can play a mask role (i.e., serve or function as a mask) when a well ion-implantation process is performed. FIG. 5 shows a well ion-implantation process using a well photoresist pattern.

When a well ion-implantation process is performed on a semiconductor substrate 10 having a well photoresist pattern 30b, some of ions 60 implanted towards the substrate 10 are scattered by interaction with the well photoresist pattern 30b. The well photoresist pattern 30b has a rounded upper edge so that a well proximity effect of the scattered ions 60a can be reduced or prohibited.

The present method for forming a well photoresist pattern on a semiconductor device can prevent or reduce a well proximity effect by rounding an upper edge of a well photoresist pattern. In addition, the invention can reduce adverse effects on the threshold voltage and the saturation current of device formed in wells manufactured using the inventive process (e.g., the number or percentage of devices having a threshold voltage and/or saturation current in a normal or target range may increase).

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a well photoresist pattern on a semiconductor, comprising the steps of:

forming a photoresist on or over a semiconductor substrate;

soft-baking the photoresist;

exposing the photoresist to light and defocusing the depth of focus (DOF) of the light transmitted to the substrate;

baking the photoresist after the exposing step;

developing the exposed photoresist to form the well photoresist pattern having an upper edge sufficiently rounded to deflect injected ions away from an active area; and implanting ions into the substrate having the rounded photoresist pattern thereon to form a well prior to forming a gate electrode.

2. The method according to claim 1, further comprising hard-baking the well photoresist pattern.

3. The method according to claim 1, wherein defocusing the DOF comprises plus(+)-defocusing.

4. The method according to claim 1, further comprising forming a sacrificial oxide layer on the semiconductor substrate prior to forming the photoresist on or over the semiconductor substrate.

5. The method according to claim 4, further comprising applying a primer on the sacrificial oxide layer prior to forming the photoresist on or over the semiconductor substrate.

6. The method according to claim 5, wherein the primer comprises an organosilane capable of increasing an adhesive strength of the photoresist to the sacrificial oxide layer.

7. The method according to claim 5, wherein the primer comprises an organosilazane and/or organosiloxane primer.

8. The method according to claim 5, wherein the primer comprises hexamethyldisilazane (HMDS).

9. The method according to claim 4, wherein forming the sacrificial oxide comprises depositing silicon dioxide by chemical vapor deposition (CVD).

10. The method according to claim 4, wherein forming the sacrificial oxide comprises growing a thermal oxide.

11. The method according to claim 1, wherein soft-baking the photoresist comprises heating at a temperature from about 100 to 300° C. for a length of time sufficient to evaporate substantially all of a solvent from the step of forming the photoresist.

12. The method according to claim 11, wherein soft-baking the photoresist comprises heating for a length of time from about 3 to 20 minutes.

13. The method according to claim 1, wherein exposing the photoresist to light comprises transmitting the light through a well mask using a stepper.

14. The method according to claim 1, wherein baking the photoresist comprises heating at a temperature from about 150 to 350° C. for a length of time sufficient to render an exposed or non-exposed portion of the photoresist substantially insoluble to a solvent used in the subsequent developing step.

15. The method according to claim 1, wherein the exposed photoresist is developed with an aqueous base solution.

16. The method according to claim 15, wherein the aqueous base solution comprises tetramethylammonium hydroxide (TMAH).

17. The method according to claim 2, wherein hard-baking the well photoresist comprises heating at a temperature from about 200 to 400° C. for a length of time sufficient to improve adhesion of the well photoresist to the underlying substrate.

18. The method according to claim 4, wherein hard-baking the well photoresist comprises heating at a temperature from about 200 to 400° C. for a length of time sufficient to improve adhesion of the well photoresist to the underlying sacrificial oxide layer.

* * * * *